(12) United States Patent
Auerswald et al.

(10) Patent No.: US 6,930,373 B2
(45) Date of Patent: Aug. 16, 2005

(54) CIRCUIT ARRANGEMENT

(75) Inventors: Gerd Auerswald, Neuhof A.D.Zenn (DE); Kurt Gross, Laaber (DE); Michael Kirchberger, Neutraubling (DE); Stefan Kulig, Neutraubling (DE); Hans Rappl, Nittendorf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/649,839

(22) Filed: Aug. 27, 2003

(65) Prior Publication Data

US 2004/0169268 A1 Sep. 2, 2004

Related U.S. Application Data

(63) Continuation of application No. PCT/DE02/00601, filed on Feb. 20, 2002.

(51) Int. Cl.[7] .................................................. H01L 29/201
(52) U.S. Cl. ...................... 257/579; 257/586; 257/593; 257/666; 363/56.02; 363/132; 363/141; 363/720
(58) Field of Search ................................. 257/579, 586, 257/593, 666; 363/56.02, 132, 141, 720

(56) References Cited

U.S. PATENT DOCUMENTS

| | | | | |
|---|---|---|---|---|
| 4,670,833 A | * | 6/1987 | Sachs .......................... | 363/132 |
| 5,274,541 A | * | 12/1993 | Kimura et al. ........... | 363/56.02 |
| 6,160,326 A | | 12/2000 | Iversen et al. ............... | 307/147 |
| 6,166,937 A | * | 12/2000 | Yamamura et al. ......... | 363/141 |
| 6,201,701 B1 | * | 3/2001 | Linden et al. .............. | 361/720 |

FOREIGN PATENT DOCUMENTS

| | | | | |
|---|---|---|---|---|
| DE | 197 27 548 A1 | * | 1/1999 | ............ H05K/7/02 |
| DE | 199 24 994 A1 | * | 12/2000 | ............ H05K/1/14 |
| EP | 0 886 368 A2 | | 1/1998 | ............ H02M/1/00 |

* cited by examiner

*Primary Examiner*—David Nelms
*Assistant Examiner*—Dao H. Nguyen
(74) *Attorney, Agent, or Firm*—Baker Botts L.L.P.

(57) ABSTRACT

The circuit has a power stage (LE) with heat generating components mounted around at least one component that generates less heat mounted in an inner region. The heat generating components are connected to at least one conducting metal body (K1) that is mounted on a cooling body (KK) in electrically insulated manner to cool the components. The cooling body encloses the inner region.

17 Claims, 3 Drawing Sheets

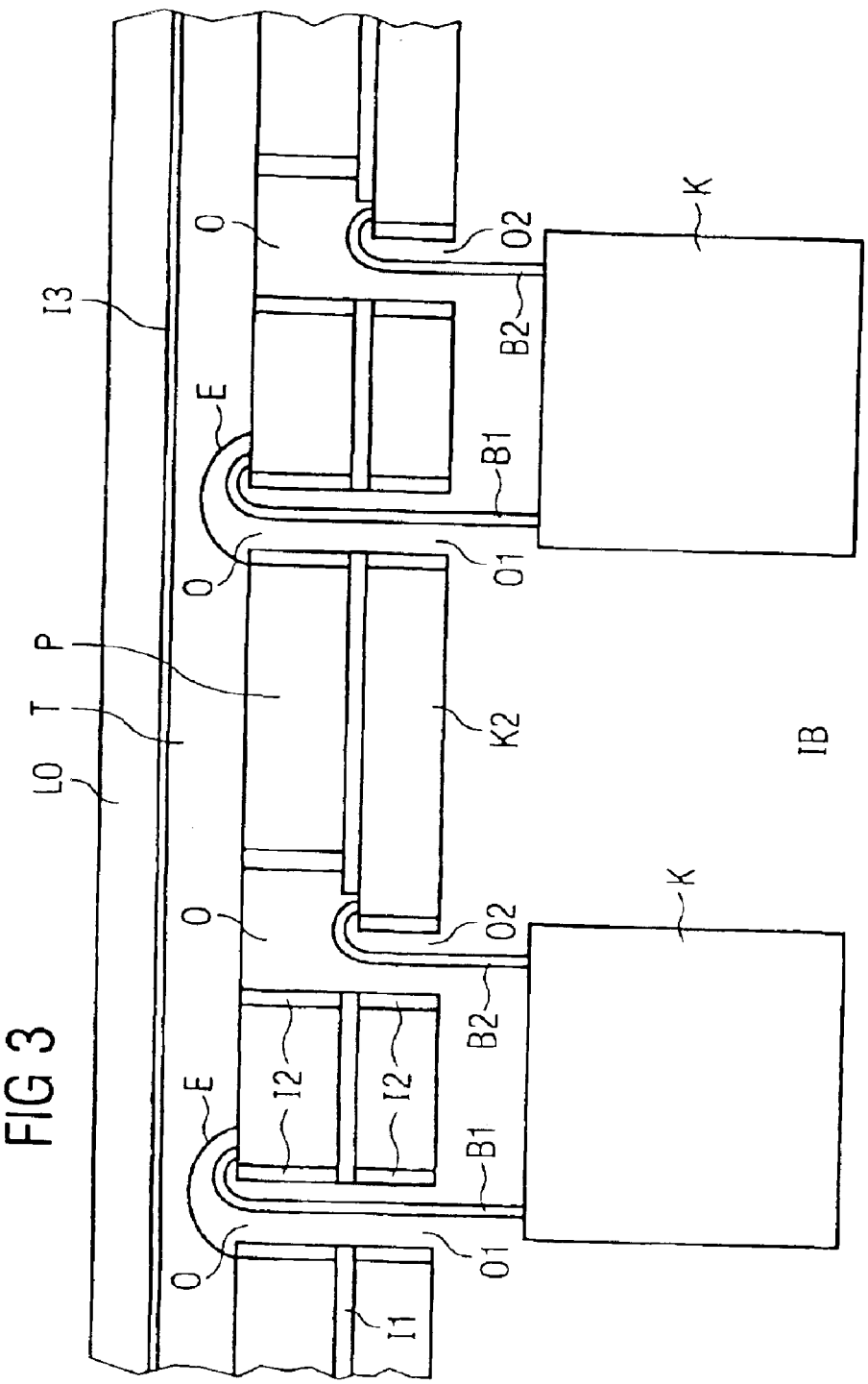

CIRCUIT ARRANGEMENT

CROSS REFERENCE TO RELATED APPLICATION

This application is a continuation of copending International Application No. PCT/DE02/00601 filed Feb. 20, 2002 and claiming a priority date of Feb. 27, 2001, which designates the United States.

TECHNICAL FIELD OF THE INVENTION

The invention relates to a circuit arrangement, i.e. an arrangement comprising interconnected components. In more specific terms, the invention relates to a circuit arrangement having a power section. The circuit arrangement should therefore be suitable for high currents.

BACKGROUND OF THE INVENTION

The fabrication of circuit arrangements in hybrid technology is known. To this end, chips having semiconductor devices without chip packaging are mounted on a ceramic carrier, in which conducting paths are arranged. The chips are mounted in such a way that a direct electrical contact is formed between the conducting paths and chips. Further electrical conductors for the chips are created via wire bonds.

Such a circuit arrangement is advantageous in that it has low space requirements as the chips are bare. However, such a circuit arrangement is disadvantageous in that it is not suitable as a power module for very high currents, such as 300 amperes continuous current, as conducting paths arranged in a ceramic carrier cannot generally conduct such high currents.

A further disadvantage exists in that heat from a circuit arrangement having a ceramic carrier cannot be effectively dissipated. Effective heat dissipation, however, is required for high current applications, as in this case the components usually generate considerable heat losses, which could cause damage to the components.

SUMMARY OF THE INVENTION

The object of the invention is to specify a circuit arrangement, which has low space requirements and at the same time is suitable for high currents.

The object can be achieved by means of a circuit arrangement having the following features: the circuit arrangement has a power section, comprising heat-generating components and at least one component producing less heat. The component producing less heat is arranged in an internal region of the circuit arrangement. The heat-generating components are arranged around the internal region and are mounted on at least one metallic body acting as an electrical conductor, to which said components are electrically connected. In order to cool the heat-generating components, the body is arranged on a heat sink in an electrically insulating manner, at least in the region of the heat-generating components. The heat sink is embodied running around the internal region.

The heat-generating components are directly mounted on the body, which at the same time acts as a carrier of the heat-generating components and as an electrical conductor. No further conductors and wires are required between the heat-generating components and the body, which would increase the electrical resistance. The electrical resistance of the body is very low in comparison to conductor paths arranged in an insulating carrier. The circuit arrangement is therefore suitable for high currents.

Furthermore, it is possible for heat produced in the heat-generating components to be dissipated very quickly, as essentially only the metallic body is arranged between the heat-generating components and the heat sink, and this metallic body is a better thermal conductor than a carrier made of ceramic.

The circuit arrangement takes up very little space, as the heat sink is only arranged under the components which generate high heat losses.

This also makes the circuit arrangement very compact, as the heat-generating components are arranged around the component producing less heat, so that it is possible for connections between the components to be very short.

The dimensioning of the body depends on the amperage and thermal conductivity to be achieved. The body is preferably between approx. 2 mm and 4 mm thick and is essentially made of copper. However, other materials are also suitable for the body, such as aluminum.

The heat-generating components may be chips, containing for example (power) transistors, diodes or IGBTs. The component producing less heat may for example be a capacitor.

To reduce the space requirements of the circuit arrangement and to improve the heat dissipation, it is advantageous for the chips to have no packaging.

The circuit arrangement also preferably has a logic section in addition to the power section, via which the power section can be controlled.

To reduce the space requirements of the circuit arrangement, it is advantageous for the logic section to be arranged above the internal region. This is advantageous in that electrical connections between the logic section and power section can be very short. The connections can for example be wire bonds. Additional connecting lines and high-cost plug connections susceptible to interference are not necessary.

The circuit arrangement can have a board which covers the internal region and is arranged above the component producing less heat. The board has at least one opening above the internal region. The component producing less heat is electrically connected to the board by means of a first wired bond, which is led through the opening.

On account of the first wired bond, the board has areas of non-flatness. To ensure that the logic section can be added to a flat surface, it is advantageous to provide a carrier, which is arranged above the internal region and above the board. The carrier can be electrically insulated from the board by means of an insulating layer. The surface of the carrier facing the board has an indentation in the region of the first wired bond, in order to accommodate the first wired bond. The surface of the carrier facing away from the board, however, is flat. The logic section is electrically insulated on the surface of the carrier facing away from the board. The carrier acts as the mechanical adapter between the board and the logic section.

If the logic section proves to be faulty, it can easily be removed from the carrier and repaired and/or replaced independently from the power section.

More than one component producing less heat may be provided, arranged in the internal region of the circuit arrangement and electrically connected to the board by means of the first wired bonds. The carrier accordingly has more than one indentation.

The carrier is preferably made of a material essentially having high thermal conductivity, so that heat generated in the logic section can be dissipated to the heat sink via the carrier and board. For example the carrier is essentially made of aluminum and is between 1 and 10 mm thick.

The circuit arrangement is particularly suitable for the parallel connection of half bridges. To this end, the heat-generating components are embodied as bare first chips and second chips, which each contain a transistor, with the first chips being mounted on at least one first metallic body and the second chips being mounted on a second metallic body. The first body is embodied as a bar, which runs along the outer edge of the heat sink. The second body is embodied in the form of a board and covers the internal region and inner edge of the heat sink. The board is arranged on the second body in an electrically insulating manner. The second body has a first opening above the internal region, which is arranged under the opening of the board and through which the first wired bond is led. The second body has at least one second opening above the internal region. The component producing less heat is embodied as a capacitor and is electrically connected to the second body by means of a second wired bond, which is led through the second opening. The first wired bond and the second wired bond are in this case capacitor terminals. The first chips are electrically connected to the board via wire bonds. The second chips are electrically connected to the first body via wire bonds.

The second body and the board form two metal boards which are electrically insulated from each other and which carry different potentials. The capacitor is placed between the different potentials.

The first chips are connected in parallel between the first body and the board. The second chips are connected in parallel between the first body and the second body. Each first chip and second chip form a half bridge. The half bridges are connected in parallel between the board and the second body.

Thanks to the surrounding arrangement of the heat sink, it is possible to ensure a particularly compact arrangement of numerous half bridges. In this way, the second chips are interconnected by means of the second body in the form of a board.

More than one first bar may be provided, each running along an edge of the cooling body for example. The first bodies are preferably not electrically connected to each other, so that they can conduct different phases.

The first body, second body and board are made of copper for example. However, other materials are also suitable, for instance aluminum.

BRIEF DESCRIPTION OF THE DRAWINGS

An embodiment of the invention is described in more detail below using the figures.

FIG. 3 shows a cross-section through an internal region of the circuit arrangement, in which capacitors, first wired bonds, second wired bonds, openings, first openings, second openings, insulating layers, the second body, board, carrier and logic section can be seen.

DETAILED DESCRIPTION OF THE PREFERRED EMBODIMENTS

A circuit arrangement is provided in the embodiment, which has a power section LE and a logic section LO.

The power section LE comprises a parallel connection of half bridges as well as capacitors K connected in parallel. The capacitors K form components of the circuit arrangement producing less heat.

Figure 2:
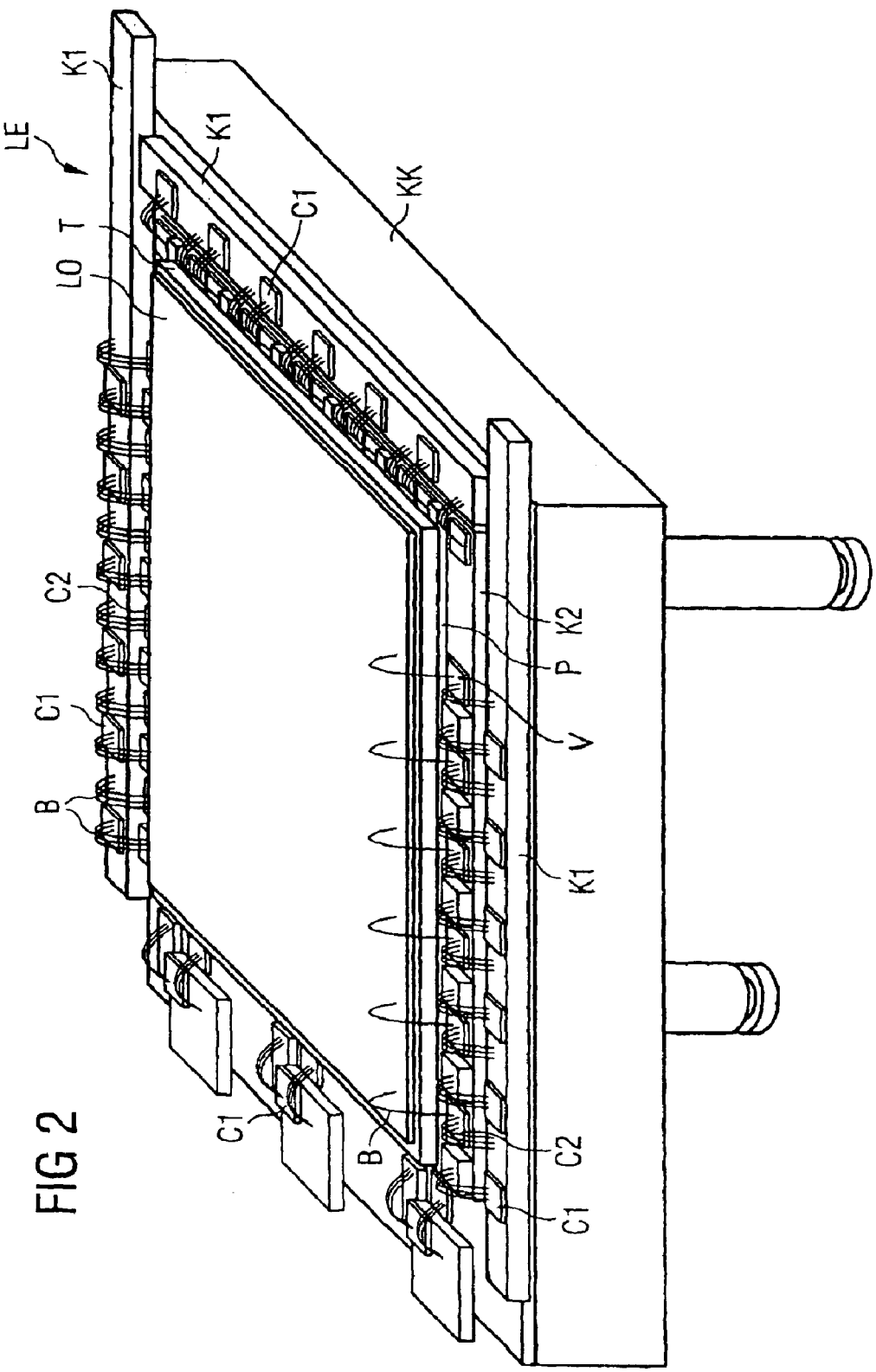
FIG. 2 shows a three-dimensional view of the circuit arrangement, in which the first chips, second chips, a first body, second body, board, carrier, logic section, heat sink and bonding connections can be seen.

The power section LE comprises first chips C1 as heat-generating components, with said chips being mounted without packaging directly on several first metallic bodies K1, which are embodied as bars and are essentially made of copper (see FIG. 2). The first bodies K1 are arranged along outer edges of a heat sink KK running around an internal region IB of the circuit arrangement. The first chips C1 each have a transistor. The first chips C1 are arranged on the first bodies K1 in such a way that first source/drain areas of the first chips C1 are electrically connected to the first bodies K1.

The first bodies K1 are approx. 4 mm thick, approx. 10 mm wide and approx. 12 cm and/or 18 cm long. The first bodies K1 are electrically separated from each other and conduct different phases.

The power section LE has second chips C2 as heat-generating components, said chips being embodied as the first chips C1 and being mounted without packaging directly on a second metallic body K2 in such a way that first source/drain areas of the transistors of the second chips C2 are electrically connected to the second body K2. The second body K2 is embodied in the form of a board, is essentially made of copper and covers the internal region and inner edges of the heat sink KK (see FIG. 2). The capacitors K are arranged under the second body K2 in the internal region IB (see FIG. 3).

Second source/drain areas of the second chips C2 are connected to the first bodies K1 via bonding connections B.

A metallic board P, which is essentially made of copper, is arranged on the second body K2 in an electrically insulating manner by means of a first insulating layer I1 (see FIGS. 2 and 3). The board P has notch-like projections V, which are arranged between adjacent second chips C2. Second source/drain areas of the transistors of the first chips C1 are connected to the projections V of board P via bonding connections B.

The second body K2 has first openings O1 and second openings O2 above the internal region. Board P has openings O above the first openings O1 and second openings O2 of the second body K2. The capacitors K are electrically connected to board P via first wired bonds B1, which are led through the first openings O1 of the second body K2 and through the openings O of board P arranged thereabove. The capacitors K are electrically connected to the second body K2 via second wired bonds B2, which are led through the second openings O2. The openings O of board P, which are arranged above the second openings of the second body K2, accommodate the second wired bonds B2. The first wired bonds B1 and the second wired bonds B2 form capacitor terminals of capacitors K.

To avoid shortcircuiting between the first wired bonds B1 and the second body K2 and/or between the second wired bonds B2 and board P, second insulating layers I2 are applied to the surfaces of openings O, first openings O1 and second openings O2.

A carrier T made of aluminum is arranged above board P (see FIG. 2). The carrier T is approx. 5 mm thick. The surface of carrier T facing board P has indentations E in the region of the first wired bonds B1, to accommodate the first wired bonds B1. The surface of carrier T facing away from board P is flat.

The logic section LO is arranged in an electrically insulating manner on the surface of carrier T facing away from board P and is connected to the power section LE via bonding connections B.

Figure 1:
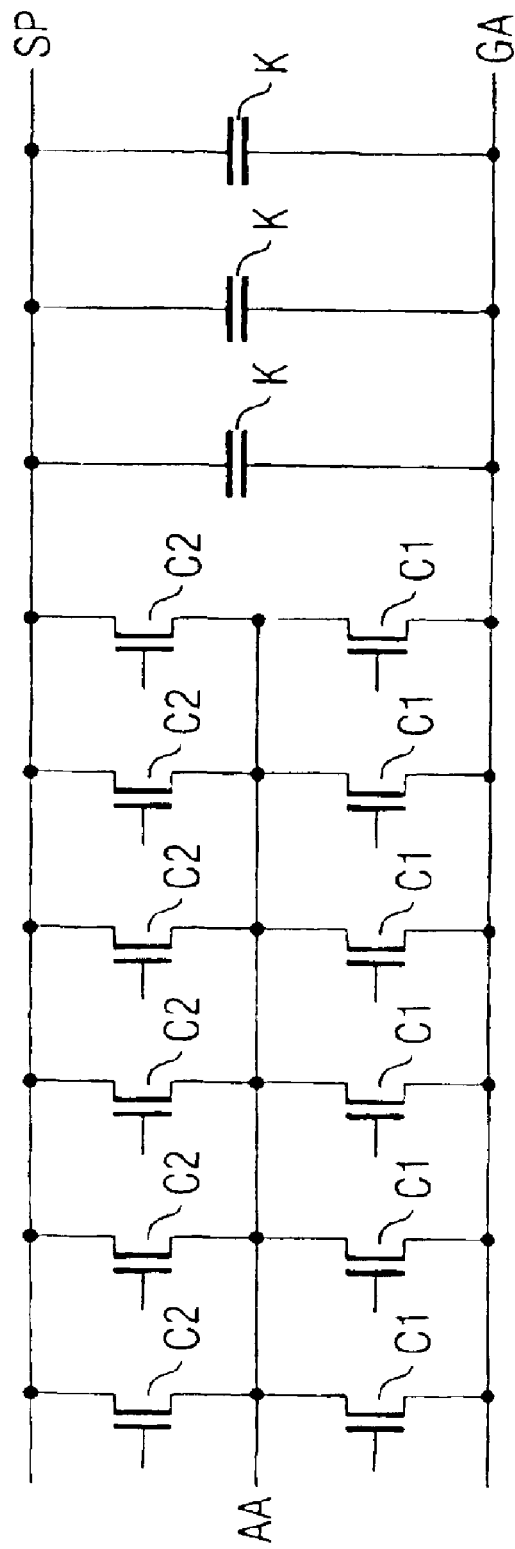
FIG. 1 shows a section of a circuit diagram of a circuit arrangement having first chips, second chips, capacitors, an output terminal, ground terminal and voltage terminal.

The first bodies K1 are connected to output terminals AA (see FIG. 1). The second body K2 is connected to a voltage terminal SP, which is loaded with approx. 36 volts. The board P is connected to a ground terminal GA, which is loaded with zero volts.

The capacitors K are connected in parallel between the ground terminal GA and voltage terminal SP.

The first chips C1 are connected in parallel between the output terminal AA and ground terminal GA. The second chips C2 are connected in parallel between the output terminal AA and the voltage terminal SP. The first chips C1 form a lowside drive. The second chips C2 form a highside drive. Each first chip C1 and second chip C2 form a half bridge. The half bridges are connected in parallel between the ground terminal GA and the voltage terminal SP.

What is claimed is:

1. A circuit arrangement comprising:
   a power section, which comprises heat-generating components comprising first and second chips and at least one component producing less heat,
   the component producing less heat being arranged in an internal region of the circuit arrangement, and
   the heat-generating components being arranged around the internal region and being mounted on one of at least two metallic bodies acting as electrical conductors, said bodies being electrically connected to the heat-generating components, wherein
   the bodies are arranged in an electrically insulating manner on a heat sink, in order to cool the heat-generating components, said bodies comprising a first metallic body and a second metallic body, said first chips being mounted on the first metallic body running along the outer edge of the heat sink, and said second chips being mounted on the second metallic body covering the internal region of the heat sink.

2. A circuit arrangement according to claim 1, further comprising:
   a logic section, which is arranged above the internal region,
   wherein the logic section is electrically connected to the power section via bonding connections.

3. A circuit arrangement according to claim 2, further comprising
   a third metallic body, covering the internal region and arranged above the component producing less heat,
   said third metallic body having at least one opening above the internal region and the component producing less heat being electrically connected to the third metallic body via a first wired bond, which is led through the opening, and
   a carrier, arranged in an electrically insulating manner above the internal region and above the third metallic body,
   the surface of the carrier facing the third metallic body having an indentation in the region of the first wired bond, to accommodate the first wired bond,
   wherein the surface of the carrier facing away from the third metallic body being essentially flat, and
   the logic section arranged in an electrically insulating manner on the surface of the carrier facing away from the third metallic body.

4. A circuit arrangement according to claim 3, wherein the carrier comprises essentially aluminum.

5. A circuit arrangement according to claim 1, further comprising:
   a third metallic body covering the internal region arranged above the component producing less heat,
   wherein
   the third metallic body comprises at least one opening above the internal region,
   the component producing less heat being embodied as a capacitor and being electrically connected to the third metallic body via a first wired bond, which is led through the opening,
   the heat-generating components being embodied as bare first chips and second chips, each containing a transistor,
   the first chips being electrically connected to the first metallic body via bonding connections, and
   the second chips being electrically connected to the second metallic body via bonding connections.

6. A circuit arrangement according to claim 1,
   wherein the first metallic body, the second metallic body and the third metallic body are comprised of essentially copper.

7. A circuit arrangement comprising:
   a set of first chips,
   a set of second chips
   a heat sink having an inner top surface region and an outer top surface region of lesser area,
   a first metallic body arranged on top of the heat sink and substantially covering the inner top surface region of the heat sink, and
   a set of metallic bodies arranged on top of the heat sink running along the outer top surface region of the heat sink and surrounding the first metallic body, wherein the first chips are mounted on the first metallic body and the second chips are mounted on the set of metallic bodies.

8. The arrangement of claim 7, wherein the first metallic body and the set of metallic bodies comprise copper.

9. The arrangement of claim 7, wherein the chips are electrically connected to the metallic body and bodies via bonding connections.

10. The arrangement of claim 7, wherein the first metallic body and the set of metallic bodies comprise aluminum.

11. The arrangement of claim 7, wherein the first chips have no packaging.

12. The arrangement of claim 7, wherein the second chips have no packaging.

13. The arrangement of claim 7, wherein the chips have no packaging.

14. The arrangement of claim 7, wherein the first chips comprise a transistor.

15. The arrangement of claim 7, wherein the second chips comprise a transistor.

16. A circuit arrangement comprising:
   a power section, which comprises heat-generating components and at least one component producing less heat,
   the component producing less heat being arranged in an internal region of the circuit arrangement, and
   the heat-generating components being arranged around the internal region and being mounted on first and second metallic bodies acting as an electrical conductors, said bodies being electrically connected to the heat-generating components, the bodies are arranged in an electrically insulating manner in the region of the heat-generating components on a heat sink, in order to cool the heat-generating components, the heat sink running underneath the internal region of the circuit arrangement with the components producing less heat, a third metallic body comprising a board covering the internal region and arranged above the component producing less heat, the board comprising at least one opening above the internal region, the component producing less heat being embodied as a capacitor and being electrically connected to the third metallic board via a first wired bond, which is led through the opening, the heat-generating components being embodied as bare first and second chips, each containing a transistor and being mounted on the two metallic bodies, the first chips mounted on the first metallic body comprising a board, the second chips mounted on the second metallic body comprising a bar, the first metallic body running along the outer edge of the heat sink, the second metallic body covering the internal region and inner edge of the heat sink, the first chips electrically connected to the first metallic body via bonding connections, and the second chips electrically connected to the second metallic body via bonding connections.

17. A circuit arrangement comprising:

a power section, which comprises heat-generating components and at least one component producing less heat, the component producing less heat being arranged in an internal region of the circuit arrangement, and the heat-generating components being arranged around the internal region and being mounted on at least one metallic body acting as an electrical conductor, said body being electrically connected to the heat-generating components, wherein the body is arranged in an electrically insulating manner in the region of the heat-generating components on a heat sink, in order to cool the heat-generating components, the heat sink running underneath the internal region of the circuit arrangement with the components producing less heat, a logic section, arranged above the internal region, said logic section electrically connected to the power section via bonding connections.

* * * * *

UNITED STATES PATENT AND TRADEMARK OFFICE
CERTIFICATE OF CORRECTION

PATENT NO. : 6,930,373 B2
DATED : August 16, 2005
INVENTOR(S) : Auerswald et al.

It is certified that error appears in the above-identified patent and that said Letters Patent is hereby corrected as shown below:

<u>Title page,</u>
Insert Item -- [30] Foreign Application Priority Data:
February 27, 2001 (DE)            101 09 329.2 --.

Signed and Sealed this

First Day of November, 2005

JON W. DUDAS
*Director of the United States Patent and Trademark Office*